(12) United States Patent
Hsu et al.

(10) Patent No.: US 9,318,047 B2
(45) Date of Patent: Apr. 19, 2016

(54) ORGANIC LIGHT EMITTING DISPLAY UNIT STRUCTURE AND ORGANIC LIGHT EMITTING DISPLAY UNIT CIRCUIT

(71) Applicant: Au Optronics Corporation, Hsinchu (TW)

(72) Inventors: Wei-Chu Hsu, Taipei (TW); Pi-Cheng Wu, Taipei (TW); Tsung-Ting Tsai, Tainan (TW)

(73) Assignee: Au Optronics Corporation, Hsinchu (TW)

( * ) Notice: Subject to any disclaimer, the term of this patent is extended or adjusted under 35 U.S.C. 154(b) by 528 days.

(21) Appl. No.: 13/651,476

(22) Filed: Oct. 15, 2012

(65) Prior Publication Data
US 2013/0314308 A1    Nov. 28, 2013

(30) Foreign Application Priority Data

May 22, 2012    (TW) .............................. 101118199 A (51) Int. Cl.
*G09G 3/32* (2006.01)
*G09G 3/30* (2006.01)
*G09G 3/10* (2006.01)
*H01L 27/32* (2006.01)

(52) U.S. Cl.
CPC ............ *G09G 3/3233* (2013.01); *G09G 3/3291* (2013.01); *G09G 2300/0465* (2013.01); *G09G 2300/0814* (2013.01); *G09G 2300/0819* (2013.01); *G09G 2300/0852* (2013.01); *G09G 2300/0861* (2013.01); *G09G 2310/0262* (2013.01); *G09G 2320/043* (2013.01); *H01L 27/3276* (2013.01)

(58) Field of Classification Search
CPC ...... G09G 3/30; G09G 3/3208; G09G 3/3233
USPC .............................................. 345/76–82, 212
See application file for complete search history.

(56) References Cited

U.S. PATENT DOCUMENTS

| 6,771,028 | B1 | 8/2004 | Winters |
| 6,982,690 | B2 | 1/2006 | Lee et al. |
| RE42,623 | E | 8/2011 | Matsueda et al. |
| 8,410,481 | B2 | 4/2013 | Liu |
| 8,710,506 | B2 | 4/2014 | Liu |
| 8,730,133 | B2 | 5/2014 | Tanikame |

(Continued)

FOREIGN PATENT DOCUMENTS

| CN | 101471028 | 7/2009 |
| CN | 101644587 | 2/2010 |

(Continued)

*Primary Examiner* — Amit Chatly
(74) *Attorney, Agent, or Firm* — Jianq Chyun IP Office (57) ABSTRACT

An organic light emitting display unit structure including a first pixel, a second pixel adjacent to the first pixel, a first scan line electrically connected to the first pixel, a second scan line electrically connected to the second pixel, a data line, a power line, a sustaining signal line, a common reset signal line and a common light emitting signal line is provided. The power line and the sustaining signal line are respectively electrically connected to both of the first pixel and the second pixel. The data line intersects with the first scan line and the second scan line and is electrically connected to the first pixel and the second pixel. The common reset signal line and the common light emitting signal line are substantially disposed inside the first pixel and the second pixel respectively and are electrically connected to the first pixel and the second pixel.

20 Claims, 8 Drawing Sheets

(56) References Cited

U.S. PATENT DOCUMENTS

| | | |
|---|---|---|
| 2003/0189559 A1 | 10/2003 | Lee et al. |
| 2006/0103323 A1* | 5/2006 | Eom et al. ............ 315/169.3 |
| 2007/0001937 A1* | 1/2007 | Park et al. ............... 345/76 |
| 2007/0146247 A1* | 6/2007 | Huang et al. ............. 345/76 |
| 2009/0167646 A1 | 7/2009 | Tanikame |
| 2010/0207889 A1 | 8/2010 | Chen et al. |
| 2012/0007080 A1 | 1/2012 | Liu |
| 2013/0146857 A1 | 6/2013 | Liu |
| 2013/0153908 A1 | 6/2013 | Liu |

FOREIGN PATENT DOCUMENTS

| | | | |
|---|---|---|---|
| CN | 102005182 | * | 4/2011 |
| TW | 548615 | | 8/2003 |
| TW | 200802841 | | 1/2008 |
| TW | 201013924 | | 4/2010 |
| TW | 201030698 | | 8/2010 |
| TW | 201203203 | | 1/2012 |

* cited by examiner

ORGANIC LIGHT EMITTING DISPLAY UNIT STRUCTURE AND ORGANIC LIGHT EMITTING DISPLAY UNIT CIRCUIT

CROSS-REFERENCE TO RELATED APPLICATION

This application claims the priority benefit of Taiwan application serial no. 101118199, filed on May 22, 2012. The entirety of the above-mentioned patent application is hereby incorporated by reference herein and made a part of this specification.

BACKGROUND

1. Field of the Invention

The invention relates to an organic light emitting display unit structure and an organic light emitting display unit circuit, and more particularly, to an organic light emitting display unit structure and an organic light emitting display unit circuit which conduce to increase a light emitting area of an organic light emitting diode (OLED).

2. Description of Related Art

During recent years, with flourishing development of semiconductor techniques and high-tech industries, digital products such as mobile phone, digital camera and notebook have been more and more widely used, and have been designed toward the direction of being convenient, multifunction, and stylish. As user's demand for digital products has grown, display screen, which plays an important role in digital products, has become designers' focus of attention. Since these digital products have been improved to be light, thin, short and small, panel type display devices are introduced accordingly, and have become the mainstream in the display market.

In an organic light emitting display panel, for example, a driving circuit and an organic light emitting diode are disposed in each pixel on the panel. A thin film transistor (TFT) in the driving circuit controls a current flown into the organic light emitting diode to drive the organic light emitting diode to emit light. In addition, a plurality of pixels arranged in array on the panel is controlled respectively through scan lines and data lines. Therefore, a required gray level brightness for displaying an image is provided by selecting a specific pixel and supplying an appropriate current to a corresponding organic light emitting diode.

SUMMARY OF THE INVENTION

The invention provides an organic light emitting display unit structure, increasing a light emitting area of an organic light emitting diode and a life span of an organic light emitting display unit.

The invention provides an organic light emitting display unit circuit, decreasing the number of signal lines used and maintaining a good driving performance.

The invention proposes an organic light emitting display unit structure, including a first pixel, a second pixel, a first scan line, a second scan line, a data line, a power line, a sustaining signal line, a common reset signal line and a common light emitting signal line. The first pixel is adjacent to the second pixel. The first scan line is electrically connected to the first pixel, and the second scan line is electrically connected to the second pixel. The data line intersects with the first scan line and the second scan line, and is electrically connected to the first pixel and the second pixel. The power line and the sustaining signal line are respectively electrically connected to both of the first pixel and the second pixel. The common reset signal line and the common light emitting signal line are substantially disposed inside the first pixel and the second pixel, respectively, and are electrically connected to the first pixel and the second pixel.

In an embodiment of the present invention, the above-mentioned first pixel has a first driving circuit and a first organic light emitting diode, wherein the first driving circuit includes a first switch, a second switch, a third switch, a fourth switch and a first capacitor. The first switch has a first end, a second end and a third end, the first end is connected to the data line, and the second end is connected to the first scan line. The second switch has a first end, a second end and a third end, the first end is connected to the sustaining signal line, and the second end is connected to the common reset signal line. The third switch has a first end, a second end and a third end, the first end is connected to the power line to receive a first voltage, and the second end is connected to the common light emitting signal line. The fourth switch has a first end, a second end and a third end, the first end is coupled to the third end of the third switch, the second end is coupled to the third end of the first switch, and the third end is coupled to the third end of the second switch. Moreover, the first organic light emitting diode has a first end and a second end, the first terminal of the first organic light emitting diode is coupled to the third terminal of the fourth switch, and the second terminal of the first organic light emitting diode is coupled to a second voltage. The first capacitor has a first terminal and a second terminal, the first terminal is coupled to the third terminal of the first switch, and the second terminal is coupled to the third terminal of the second switch.

In an embodiment of the present invention, the above-mentioned organic light emitting display unit structure further includes a second capacitor. The second capacitor has a first terminal and a second terminal, the first terminal is coupled to the first terminal of the third switch, and the second terminal is coupled to the first terminal of the first organic light emitting diode.

In an embodiment of the present invention, the above-mentioned first scan line is substantially disposed inside the first driving circuit and the first organic light emitting diode.

In an embodiment of the present invention, the above-mentioned second pixel has a second driving circuit and a second organic light emitting diode, wherein the second driving circuit includes a first switch, a second switch, a third switch, a fourth switch and a first capacitor. The first switch has a first terminal, a second terminal and a third terminal, the first terminal is connected to the data line, and the second terminal is connected to the second scan line. The second switch has a first terminal, a second terminal and a third terminal, the first terminal is connected to the sustaining signal line, and the second terminal is connected to the common reset signal line. The third switch has a first terminal, a second terminal and a third terminal, the first terminal is connected to the power line to receive a first voltage, and the second terminal is connected to the common light emitting signal line. The fourth switch has a first terminal, a second terminal and a third terminal, the first terminal is coupled to the third terminal of the third switch, the second terminal is coupled to the third terminal of the first switch, and the third terminal is coupled to the third terminal of the second switch. Moreover, the second organic light emitting diode has a first terminal and a second terminal, the first terminal of the second organic light emitting diode is coupled to the third terminal of the fourth switch, and the second terminal of the second organic light emitting diode is coupled to a second voltage. The first capacitor has a first terminal and a second terminal, the first terminal is coupled to the third terminal of the first switch, and the second terminal is coupled to the third terminal of the second switch.

In an embodiment of the present invention, the above-mentioned organic light emitting display unit structure further includes a second capacitor. The second capacitor has a first terminal and a second terminal, the first terminal is coupled to the first terminal of the third switch, and the second terminal is coupled to the first terminal of the second organic light emitting diode.

In an embodiment of the present invention, the above-mentioned second scan line is substantially disposed inside the second driving circuit and the second organic light emitting diode.

In an embodiment of the present invention, the above-mentioned first pixel and second pixel substantially have the same light emitting area.

In an embodiment of the present invention, the above-mentioned organic light emitting display unit structure further includes a power extension line. The power extension line is disposed inside the first pixel and the second pixel, and the power line is electrically connected to the first pixel and the second pixel through the power extension line.

In an embodiment of the present invention, the above-mentioned first scan line, second scan line, common reset signal line and common light emitting signal line extend along a first direction.

In an embodiment of the present invention, the above-mentioned data line, power line and sustaining signal line extend long a second direction substantially perpendicular to the first direction.

The present invention also proposes an organic light emitting display unit, including a first scan line, a second scan line, a data line, a power line, a sustaining signal line, a common reset signal line, a common light emitting signal line, a first pixel and a second pixel. The data line intersects with the first scan line and the second scan line. The common reset signal line and the common light emitting signal line respectively intersect with the data line. The first pixel and the second pixel respectively include both of a driving circuit and an organic light emitting diode, wherein each driving circuit includes a first switch, a second switch, a third switch, a fourth switch and a first capacitor. The first switch has a first terminal, a second terminal and a third terminal, and the first terminal is connected to the data line, wherein the second terminal of the first switch of the first pixel is connected to the first scan line, and the second terminal of the first switch of the second pixel is connected to the second scan line. The second switch has a first terminal, a second terminal and a third terminal, the first terminal is connected to the sustaining signal line, and the second terminal is connected to the common reset signal line. The third switch has a first terminal, a second terminal and a third terminal, the first terminal is connected to the power line to receive a first voltage, and the second terminal is connected to the common light emitting signal line. The fourth switch has a first terminal, a second terminal and a third terminal, the first terminal is coupled to the third terminal of the third switch, the second terminal is coupled to the third terminal of the first switch, and the third terminal is coupled to the third terminal of the second switch. Moreover, the organic light emitting diode has a first terminal and a second terminal, the first terminal of the organic light emitting diode is coupled to the third terminal of the fourth switch, and the second terminal of the organic light emitting diode is coupled to a second voltage. The first capacitor has a first terminal and a second terminal, the first terminal is coupled to the third terminal of the first switch, and the second terminal is coupled to the third terminal of the second switch.

In an embodiment of the present invention, the above-mentioned driving circuit further includes a second capacitor. The second capacitor has a first terminal and a second terminal, the first terminal is coupled to the first terminal of the third switch, and the second terminal is coupled to the first terminal of the organic light emitting diode.

In an embodiment of the present invention, the above-mentioned first switch, second switch, third switch and fourth switch respectively include an N-type thin film transistor.

In an embodiment of the present invention, the above-mentioned organic light emitting display unit circuit further includes a power extension line, and the power line is electrically connected to the first pixel and the second pixel through the power extension line.

The present invention also proposes an organic light emitting display unit circuit including a first scan line, a second scan line, a data line, a power line, a sustaining signal line, a first reset signal line, a second reset signal line, a common light emitting signal line, a first pixel and a second pixel. The data line intersects with the first scan line and the second scan line. The first reset signal line, the second reset signal line and the common light emitting signal line respectively intersect with the data line. The first pixel and the second pixel respectively include both of a driving circuit and an organic light emitting diode, wherein each driving circuit includes a first switch, a second switch, a third switch, a fourth switch and a first capacitor. The first switch has a first terminal, a second terminal and a third terminal, and the first terminal is connected to the data line, wherein the second terminal of the first switch of the first pixel is connected to the first scan line, and the second terminal of the first switch of the second pixel is connected to the second scan line. The second switch has a first terminal, a second terminal and a third terminal, the second end of the second switch of the first pixel is connected to the first reset signal line, the second end of the second switch of the second pixel is connected to the second reset signal line, and the first end is connected to the sustaining signal line. The third switch has a first terminal, a second terminal and a third terminal, the first terminal is connected to the power line to receive a first voltage, and the second terminal is connected to the common light emitting signal line. The fourth switch has a first terminal, a second terminal and a third terminal, the first terminal is coupled to the third terminal of the third switch, the second terminal is coupled to the third terminal of the first switch, and the third terminal is coupled to the third terminal of the second switch. Moreover, the organic light emitting diode has a first terminal and a second terminal, the first terminal of the organic light emitting diode is coupled to the third terminal of the fourth switch, and the second terminal of the organic light emitting diode is coupled to a second voltage. The first capacitor has a first terminal and a second terminal, the first terminal is coupled to the third terminal of the first switch, and the second terminal is coupled to the third terminal of the second switch.

The present invention further proposes an organic light emitting display unit circuit including a first scan line, a second scan line, a data line, a power line, a sustaining signal line, a common reset signal line, a first light emitting signal line, a second light emitting signal line, a first pixel and a second pixel. The data line intersects with the first scan line and the second scan line. The common reset signal line, the first light emitting signal line and the second light emitting signal line respectively intersect with the data line. The first pixel and the second pixel respectively include both of a driving circuit and an organic light emitting diode, wherein each driving circuit includes a first switch, a second switch, a third switch, a fourth switch and a first capacitor. The first switch has a first terminal, a second terminal and a third terminal, and the first terminal is connected to the data line, wherein the second terminal of the first switch of the first pixel is connected to the first scan line, and the second terminal of the first switch of the second pixel is connected to the second scan line. The second switch has a first terminal, a second terminal and a third terminal, the first terminal is connected to the sustaining signal line, and the second terminal is connected to the common reset signal line. The third switch has a first terminal, a second terminal and a third terminal, the first terminal is connected to the power line to receive a first voltage, the second terminal of the third switch of the first pixel is connected to the first light emitting signal line, and the second terminal of the third switch of the second pixel is connected to the second light emitting signal line. The fourth switch has a first terminal, a second terminal and a third terminal, the first terminal is coupled to the third terminal of the third switch, the second terminal is coupled to the third terminal of the first switch, and the third terminal is coupled to the third terminal of the second switch. Moreover, the organic light emitting diode has a first terminal and a second terminal, the first terminal of the organic light emitting diode is coupled to the third terminal of the fourth switch, and the second terminal of the organic light emitting diode is coupled to a second voltage. The first capacitor has a first terminal and a second terminal, the first terminal is coupled to the third terminal of the first switch, and the second terminal is coupled to the third terminal of the second switch.

Based on the above, the present invention provides an organic light emitting display unit structure, wherein the adjacent first and second pixels are connected to the same reset signal line and the same light emitting signal line. As a result, an area originally for disposing the signal lines is decreased, and a light emitting area of an organic light emitting diode is thereby increased. The present invention further provides an organic light emitting display unit circuit, maintaining a good driving performance in a situation where the number of signal lines used in an organic light emitting display unit is decreased. Based on this, an organic light emitting display unit is able to provide sufficient display brightness by being driven with a low current, thus increasing a life span of the organic light emitting display unit.

In order to make the aforementioned and other objectives and advantages of the present invention comprehensible, embodiments accompanied with figures are described in detail below.

DESCRIPTION OF THE EMBODIMENTS

Figure 1:
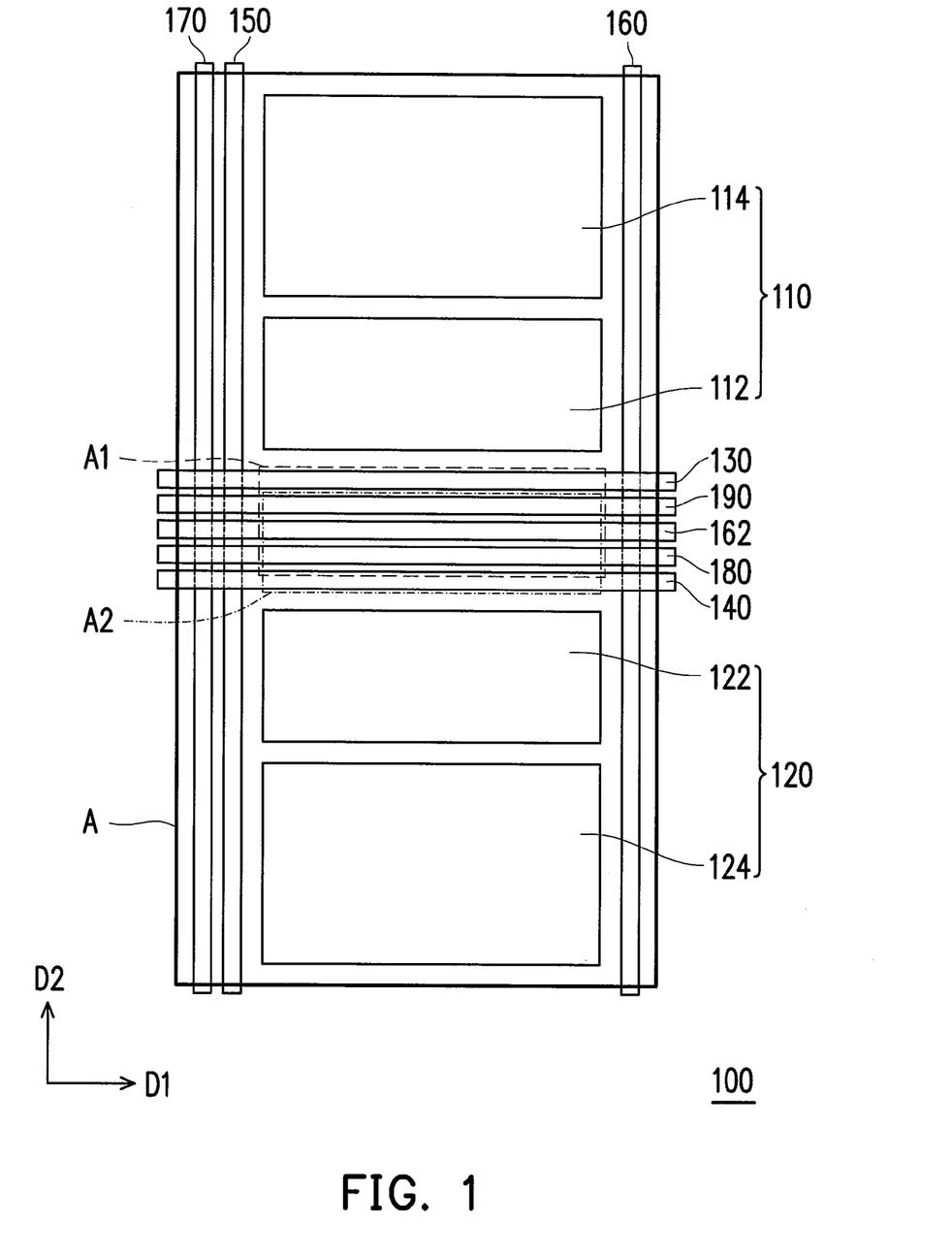
FIG. 1 is a schematic diagram of an organic light emitting display unit of an embodiment of the present invention.

FIG. 1 is a schematic diagram of an organic light emitting display unit of an embodiment of the present invention. Referring to FIG. 1, in the present embodiment, an organic light emitting display unit 100 comprises a first pixel 110, a second pixel 120, a first scan line 130, a second scan line 140, a data line 150, a power line 160, a sustaining signal line 170, a common reset signal line 180 and a common light emitting signal line 190.

In the present embodiment, the first pixel 110 is adjacent to the second pixel 120. The first pixel 110 has a first driving circuit 112 and a first organic light emitting diode 114, and the second pixel 120 has a second driving circuit 122 and a second organic light emitting diode 124. Therefore, the first pixel 110 and the second pixel 120 are used to provide a light source having a specific brightness to display a required gray level for displaying an image. That is to say, the organic light emitting display unit 100 not only has a light emitting function, but is also able to emit a light source having a specific brightness to present a gray level effect.

The first scan line 130, the second scan line 140, the common reset signal line 180 and the common light emitting signal line 190 extend along a first direction D1. The first scan line 130 is electrically connected to the first pixel 110, and the second scan line 140 is electrically connected to the second pixel 120. The common reset signal line 180 and the common light emitting signal line 190 are substantially disposed inside the first pixel 110 and the second pixel 120 respectively, and are electrically connected to the first pixel 110 and the second pixel 120. The common reset signal line 180 and the common light emitting signal line 190 are substantially disposed inside the first pixel 110 and the second pixel 120, respectively, which includes that the common reset signal line 180 and the common light emitting signal line 190 are substantially disposed between the first pixel 110 and the second pixel 120. Designers may arrange the disposition appropriately according to design needs. The present invention is not limited thereto.

On the other hand, the data line 150 extends along a second direction D2 being roughly perpendicular to the first direction D1. The data line 150 intersects with the first scan line 130, the second scan line 140, the common reset signal line 180 and the common light emitting signal line 190, and is electrically connected to the first pixel 110 and the second pixel 120. The power line 160 is electrically connected to the first pixel 110 and the second pixel 120, and the sustaining signal line 170 is also electrically connected to the first pixel 110 and the second pixel 120. The power line 160 and the sustaining signal line 170 preferably extend along the second direction D2, but may also extend along the first direction D1. The power line 160 and the sustaining signal line 170 which extend along the second direction D2 respectively intersect with the first scan line 130, the second scan line 140, the common reset signal line 180 and the common light emitting signal line 190. In addition, the organic light emitting display unit 100 selectively has a power extension line 162. The power extension line 162 is connected to the power line 160, and extends inside the first pixel 110 and the second pixel 120 along the first direction D1. The power line 160 is electrically connected to the first pixel 110 and the second pixel 120 through the power extension line 162.

It is worth noting that the power extension line 162 causes the power line 160 which extends along the second direction D2 to have a branch in the first direction D1 so as to be connected to the first driving circuit 112 of the first pixel 110 and the second driving circuit 122 of the second pixel 120. In other embodiments, the first driving circuit 112 of the first pixel 110 and the second driving circuit 122 of the second pixel 120 are connected to the power line 160 via other conductor members, and thus disposition of the power extension line 162 is not necessary.

In general, to realize the operation of the first driving circuit 112 and the second driving circuit 122, the first driving circuit 112 and the second driving circuit 122 respectively require to be connected to a plurality of signal lines. The first driving circuit 112, for example, is connected to the first scan line 130, the data line 150, the power extension line 162 of the power line 160, the sustaining signal line 170, the common reset signal line 180 and the common light emitting signal line 190. Accordingly, to drive the first pixel 110, the signal lines which extend along the first direction D1 require a layout area at least as large as an area A1 in FIG. 1. Similarly, to drive the second pixel 120, the signal lines which extend along the first direction D1 require a layout area at least as large as an area A2 in FIG. 1.

In the present embodiment, the first pixel 110 and the second pixel 120 are both connected to the common reset signal line 180 and the common light emitting signal line 190. Thus, it can be known from FIG. 1 that the area A1 and the area A2 are partially overlapped. Accordingly, the areas for disposing the signal lines required by the first pixel 110 and the second pixel 120 are decreased. Specifically, if two pixels are predetermined to be disposed in an area as large as the area A illustrated in FIG. 1, in a situation where no common signal line is shared by the two adjacent pixels, the area A1 and the area A2 do not overlap with each other; thus, a disposition area (aperture area) of the organic light emitting diodes in the two pixels accounts for approximately 17.26% of the area A. In comparison, according to the design of the present embodiment, a disposition area of the first organic light emitting diode 114 and the second organic light emitting diode 124 accounts for approximately 26.43% of the area A. That is to say, the design of the present embodiment is conducive to increase the disposition area of the organic light emitting diode by decreasing a required layout area of the signal lines so as to achieve a higher aperture ratio.

Figure 2:
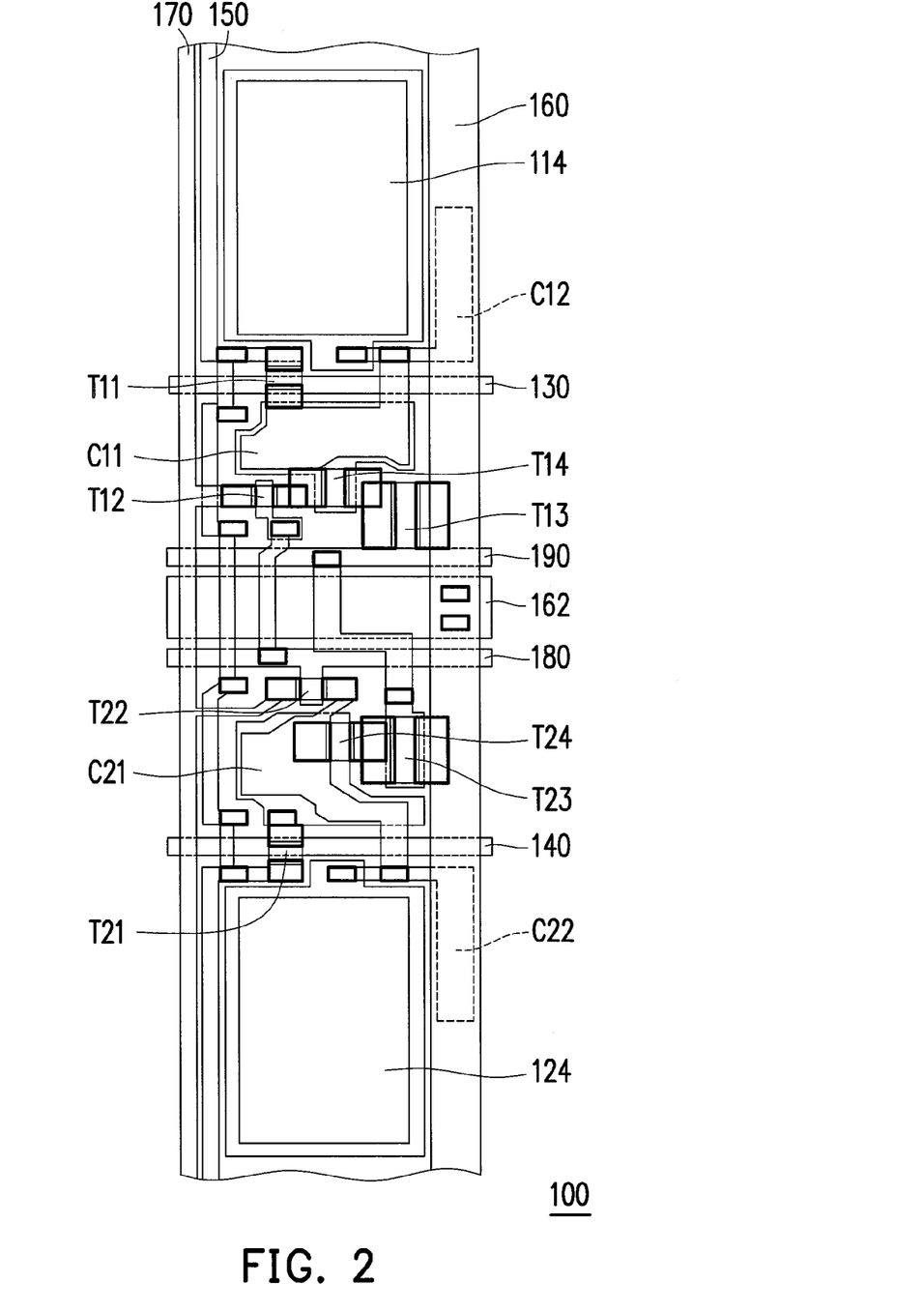
FIG. 2 is a schematic diagram of a structure of the organic light emitting display unit in FIG. 1.
Figure 3:
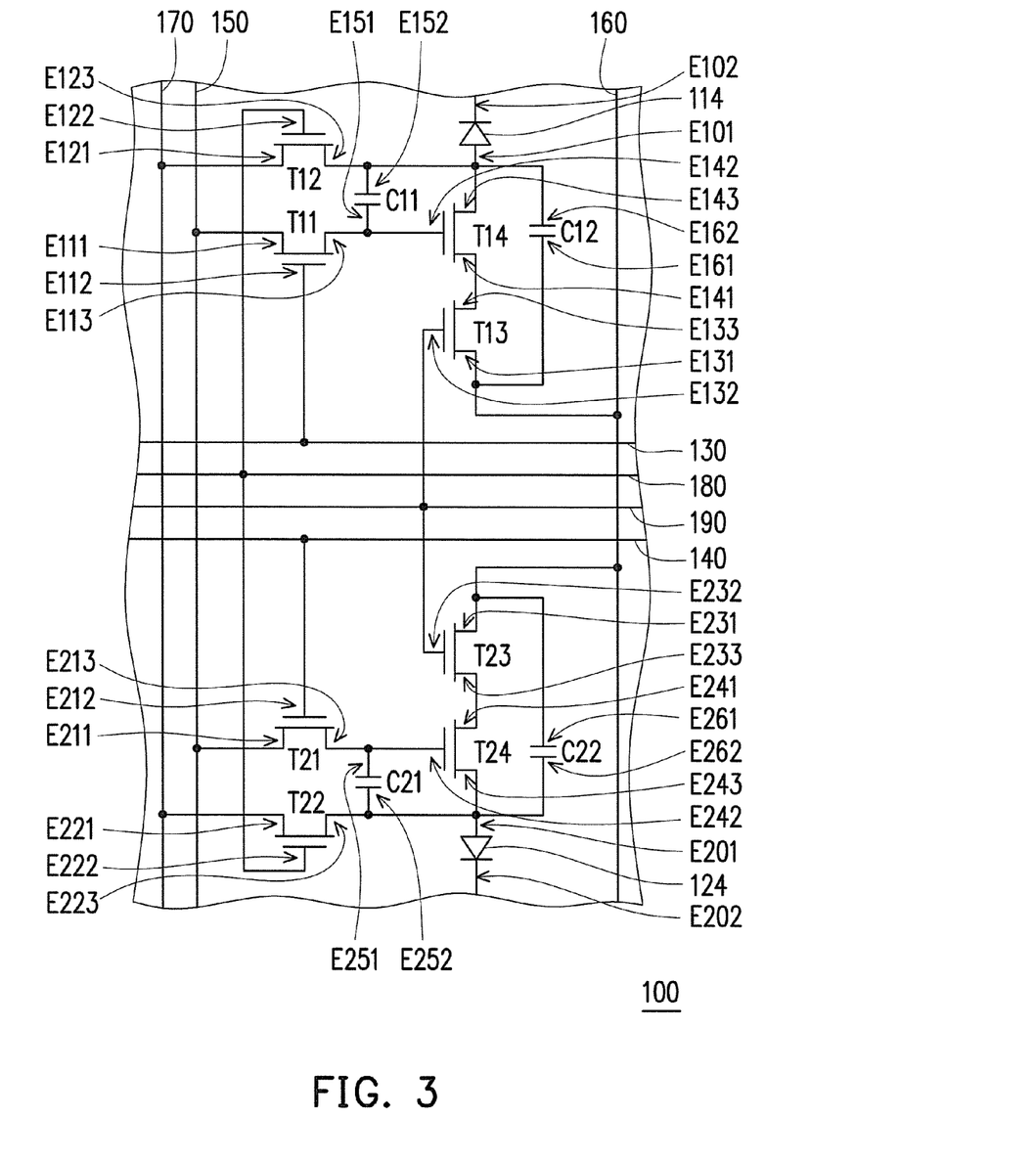
FIG. 3 is a schematic diagram of a circuit of the organic light emitting display unit in FIG. 2.

FIG. 2 is a schematic diagram of a structure of the organic light emitting display unit in FIG. 1. FIG. 3 is a schematic diagram of a circuit of the organic light emitting display unit in FIG. 2. With reference to FIG. 2 and FIG. 3, structure and circuit layout of the first pixel 110 and the second pixel 120 according to an embodiment of the present invention will be explained hereinafter in sequence. However, the following description is only one of the structures and circuit layouts of the present embodiment. Actually, the layout design of the first pixel 110 and the second pixel 120 may vary according to the disposition of elements configured inside the first pixel 110 and the second pixel 120 and the connection relationships among signal lines. The present invention is not limited thereto.

Referring to FIG. 2 and FIG. 3, in the present embodiment, the first pixel 110 has the first driving circuit 112 and the first organic light emitting diode 114, wherein the first scan line 130 is substantially disposed inside the first driving circuit 112 and the first organic light emitting diode 114, which substantially includes the disposition that the first scan line 130 is disposed between the first driving circuit 112 and the first organic light emitting diode 114. Designers may appropriately arrange the disposition of the components in another way according to design needs. The present invention is not limited thereto. The first driving circuit 112 includes a first switch T11, a second switch T12, a third switch T13, a fourth switch T14 and a first capacitor C11, wherein the first switch T11, the second switch T12, the third switch T13, and the fourth switch T14 are, for example, thin film transistors. Respective connection relationships of each switch and the first capacitor C11 with other members will be explained hereinafter in sequence.

Specifically, the first switch T11 has a first terminal E111 (which is, for example, a source electrode), a second terminal E112 (which is, for example, a gate electrode) and a third terminal E113 (which is, for example, a drain electrode). The first terminal E111 is connected to the data line 150, and the second terminal E112 is connected to the first scan line 130. The second switch T12 has a first terminal E121, a second terminal E122 and a third terminal E123. The first terminal E121 is connected to the sustaining signal line 170, and the second terminal E122 is connected to the common reset signal line 180. The third switch T13 has a first terminal E131, a second terminal E132 and a third terminal E133, the first terminal E131 is connected to the power line 160 to receive a first voltage V1, and the second terminal E132 is connected to the common light emitting signal line 190. The fourth switch T14 has a first terminal E141, a second terminal E142 and a third terminal E143, the first terminal E141 is coupled to the third terminal E133 of the third switch T13, the second terminal E142 is coupled to the third terminal E113 of the first switch T11, and the third terminal E143 is coupled to the third terminal E123 of the second switch T12.

In addition, the first organic light emitting diode 114 has a first terminal E101 and a second terminal E102, the first terminal E101 is coupled to the third terminal E143 of the fourth switch T14, and the second terminal E102 is coupled to a second voltage V2. The first capacitor C11 has a first terminal E151 and a second terminal E152, the first terminal E151 is coupled to the third terminal E113 of the first switch T11, and the second terminal E152 is coupled to the third terminal E123 of the second switch T12.

In the present embodiment, the first switch T11, the second switch T12, the third switch T13 and the fourth switch T14 are each an N-type thin film transistor (NTFT), but the present invention is not limited thereto. These switches are used to control whether an electric signal on each signal line can be transmitted away, so as to control the first organic light emitting diode 114 to display a required gray level brightness. In addition, the first capacitor C11 is used to store power to maintain operation of each switch, and to cause the first organic light emitting diode 114 to maintain a certain gray level brightness.

In addition, in the present embodiment, the first driving circuit 112 of the organic light emitting display unit 100 selectively has a second capacitor C12 having a first terminal E161 and a second terminal E162. The first terminal E161 is coupled to the first terminal E131 of the third switch T13, and the second terminal E162 is coupled to the first terminal E101 of the first organic light emitting diode 114.

The second capacitor C12 has similar functions as the first capacitor C11; it is used to store electricity, to store a voltage written by a data line. In addition, the second capacitor C12 can provide electricity to maintain the operation of each switch when the performance of the first capacitor C11 drops or is lost, such that the first organic light emitting diode 114 can maintain a desirable gray level brightness. However, in other embodiments, the second capacitor C12 can be selectively disposed or not disposed in the organic light emitting display unit 100, or is connected to other end points, according to needs. The present invention is not limited thereto.

Following an explanation of the structure and circuit layout of the first pixel 110 of the present embodiment, the structure and circuit layout of the second pixel 120 of the present embodiment will now be explained. Referring to FIG. 2 and FIG. 3, in the present embodiment, the second pixel 120 has the second driving circuit 122 and the second organic light emitting diode 124, wherein the second scan line 140 is substantially disposed inside the second driving circuit 122 and the second organic light emitting diode 124, which substantially includes the disposition that the second scan line 140 is disposed between the second driving circuit 122 and the second organic light emitting diode 124. Designers may appropriately arrange the disposition in another way according to design needs. The present invention is not limited thereto. The second driving circuit 122 includes a first switch T21, a second switch T22, a third switch T23, a fourth switch T24 and a first capacitor C21, wherein the first switch T21, the second switch T22, the third switch T23, and the fourth switch T24 are, for example, thin film transistors.

Specifically, the first switch T21 has a first terminal E211, a second terminal E212 and a third terminal E213. The second switch T22 has a first terminal E221, a second terminal E222 and a third terminal E223. The third switch T23 has a first terminal E231, a second terminal E232 and a third terminal E233. The fourth switch T24 has a first terminal E241, a second terminal E242 and a third terminal E243. Referring to FIG. 2 and FIG. 3, the second pixel 120 of the present embodiment has a similar structure as the first pixel 110. To avoid repeated descriptions, only difference between the second pixel 120 and the first pixel 110 will be described hereinafter. As for the descriptions of the other members are omitted, please refer to the corresponding members of the first pixel 110 and the drawings.

In the present embodiment, the second pixel 120 differs from the first pixel 110 mainly in that the second terminal E112 of the first switch T11 of the first pixel 110 is connected to the first scan line 130, while a second terminal E212 of the first switch T21 of the second pixel 120 is connected to the second scan line 140. This difference is due to the fact that the first pixel 110 and the second pixel 120 are connected to different scan lines in order to be separately controlled, such that the electric signals are written into the first pixel 110 and the second pixel 120 at different time. Therefore, the first switches which control the write-in of the electric signals to the two pixels require to be connected to different scan lines.

In addition, the other signal lines include the data line 150, the power line 160 and the sustaining signal line 170, all of which being directly connected to the first pixel 110 and the second pixel 120, as well as the common reset signal line 180 and the common light emitting signal line 190, shared by the first pixel 110 and the second pixel 120. Therefore, regarding the connection relationships between the other switches of the second pixel 120 and the signal lines, please refer to the above description of the first pixel 110.

On the other hand, in the present embodiment, the second organic light emitting diode 124 has a first terminal E201 and a second terminal E202, and the first capacitor C21 has a first terminal E251 and a second terminal E252. Regarding the connection relationships of the second organic light emitting diode 124 and the first capacitor C21 with other members, please refer to the first organic light emitting diode 114 and the first capacitor C11.

In the present embodiment, the first switch T21, the second switch T22, the third switch T23 and the fourth switch T24 are each an N-type thin film transistor, but the present invention is not limited thereto. These switches are used to control whether a voltage on the corresponding signal line is written into the second pixel 120, so as to control the second organic light emitting diode 124 to display a required gray level brightness. The first capacitor C21 is used to store electricity to maintain the operation of each switch, and to help the second pixel 120 to maintain a certain gray level brightness.

In addition, a second capacitor C22 is selectively disposed in the second pixel 120 of the present embodiment. The second capacitor C22 has a first terminal E261 and a second terminal E262. As for the connection relationships between the second capacitor C22 and each member of the second pixel 120, please refer to the connection relationships between the second capacitor C12 and each member of the first pixel 110. In other embodiments, a second capacitor may not be disposed in the second pixel 120. The present invention is not limited thereto.

It is worth noting that in the present embodiment, the first pixel 110 and the second pixel 120 substantially have the same light emitting area to ensure uniformity and consistency of display effects provided by the first pixel 110 and the second pixel 120. In addition, the first pixel 110 and the second pixel 120 may selectively substantially have different light emitting areas. The present invention is not limited thereto. Therefore, when the first pixel 110 and the second pixel 120 share the common reset signal line 180 and the common light emitting signal line 190, the number of signal lines and area for disposing the signal lines are decreased and light emitting areas of the first organic light emitting diode 114 and the second organic light emitting diode 124 are increased at the same time.

Particularly, according to a result verifying the performance of the design having the structure and layout of the present embodiment, respective area ratios of the first organic light emitting diode 114 and the second organic light emitting diode 124 to the first pixel 110 and the second pixel 120, are enhanced from 17.26%, when the reset signal line and the light emitting signal line are not shared, to 26.43%, when the common reset signal line 180 and the common light emitting signal line 190 are shared. Based on this, the first pixel 110 and the second pixel 120 are able to provide a sufficient brightness by being driven with a low current, thus increasing a life span of the organic light emitting display unit 100.

Figure 4:
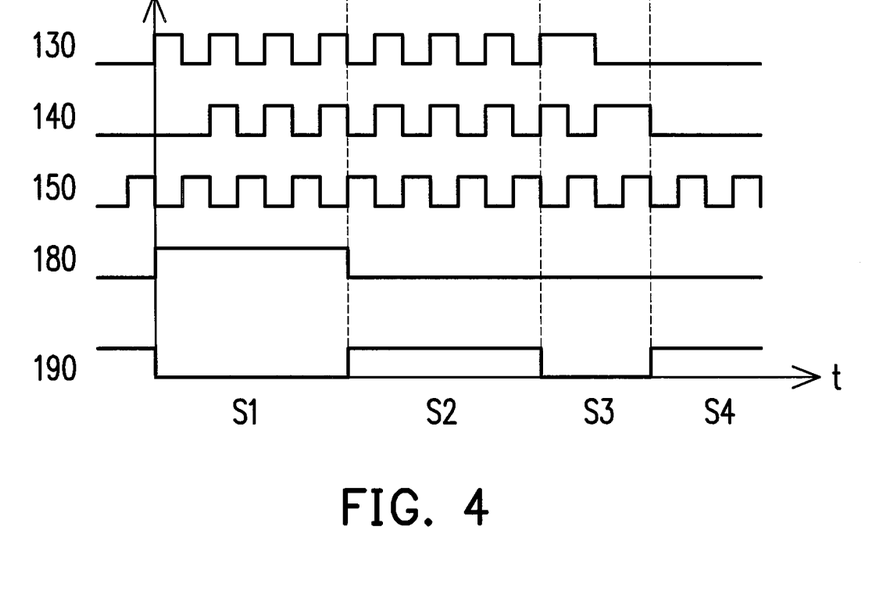
FIG. 4 is a driving waveform diagram of the circuit of the organic light emitting display unit in FIG. 3.

FIG. 4 is a timing waveform diagram of the circuit of the organic light emitting display unit in FIG. 3. Referring to FIG. 3 and FIG. 4, in the present embodiment, an operation process of the first pixel 110 and the second pixel 120 includes four stages: a reset stage S1, a compensation stage S2, a data writing stage S3, and a light emitting stage S4.

In detail, the first pixel 110 and the second pixel 120 are connected to the first scan line 130 and the second scan line 140, respectively. There is a time difference of one clock cycle between the time when the first scan line 130 and the second scan line 140 respectively switch on the first switches T11 and T21, such that an electric signal is written into the first pixel 110 and the second pixel 120 at different time.

In addition, there is a time difference of a half clock cycle between a pulse input into the first switches T11 and T21 by the data line 150 and a pulse of the first scan line 130 and the second scan line 140. In other words, the data line 150 has a timing waveform opposite to that of the first scan line 130 and the second scan line 140. Therefore, at the reset stage S1 and the compensation stage S2, an electric signal of the data line 150 is not written into the first pixel 110 and the second pixel 120 through the first switches T11 and T21. On the other hand, the power line 160 and the sustaining signal line 170 are both conducted through the corresponding switches.

When the organic light emitting display unit 100 is at the reset stage S1, the common reset signal line 180 switches on the second switches T12 and T22 so as to reset the voltages of the first capacitors C11 and C21. Then, when the organic light emitting display unit 100 is at the compensation stage S2, the common reset signal line 180 is disabled and switches off the first switches T11 and T21, the common light emitting signal line 190 switches on the third switches T13 and T23, and a driving current provided by the power line 160 enters the third switches T13 and T23, which charges the first capacitors C11 and C21 through the fourth switches T14 and T24.

When charge of the first capacitors C11 and C21 is completed, the organic light emitting display unit 100 enters the data writing stage S3. Here, the common light emitting signal line 190 switches off the third switches T13 and T23. During the data writing stage S3, clock cycles of the first scan line 130 and the second scan line 140 are extended, such that the pulse signals enabling the first scan line 130 and the second scan line 140 overlap with the pulse signals of the data line 150, so as to transmit the voltage information provided by the data line 150 to the first pixel 110 and the second pixel 120, respectively. In addition, the first scan line 130 is enabled and disabled at the time different to the second scan line 140, such that voltage information is written into the first pixel 110 and the second pixel 120 at different times.

After the voltage information is written into the first pixel 110 and the second pixel 120, respectively, the organic light emitting display unit 100 enters the light emitting stage S4. The common light emitting signal line 190 is switched on, such that a driving current is transmitted to the fourth switches T14 and T24 through the third switches T13 and T23. Based on this, a driving current is transmitted to the first organic light emitting diode 114 and the second organic light emitting diode 124, so that the first organic light emitting diode 114 and the second organic light emitting diode 124 emit light.

Owing that the first pixel 110 and the second pixel 120 share the common light emitting signal line 190, the first organic light emitting diode 114 and the second organic light emitting diode 124 emit light at the same time period, such that the first pixel 110 and the second pixel 120 can display different gray level brightness at the same time.

Figure 5:
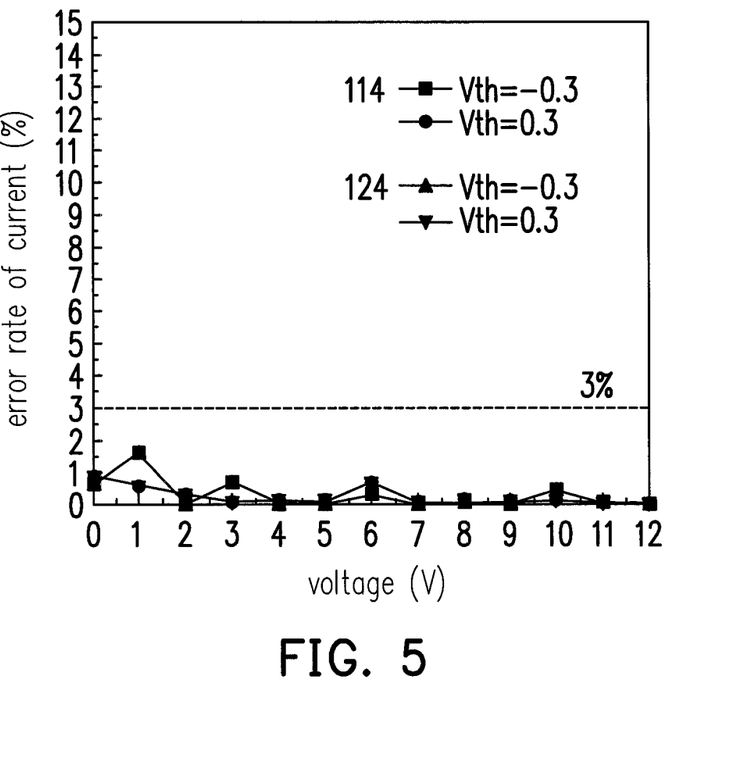
FIG. 5 is a diagram showing the relationship of voltage and error rate of a light emitting current of the organic light emitting display unit in FIG. 4.

FIG. 5 is a diagram showing the relationship of voltage and error rate of a light emitting current of the organic light emitting display unit in FIG. 4. In the present embodiment, though the first pixel 110 and the second pixel 120 share the common reset signal line 180 and the common light emitting signal line 190, the compensation function of a circuit of the organic light emitting display unit 100 is remain achieved. Therefore, when a drift of a feed-through voltage, Vth, (in FIG. 5, a negative value of Vth represents a negative drift and a positive value of Vth represents a positive drift) occurs in the fourth switches T14 and T24 of the driving circuits in the first pixel 110 and the second pixel 120, an error rate of light emitting current generated by the organic light emitting diode remains about 3% or less, as shown in FIG. 5.

Figure 6:
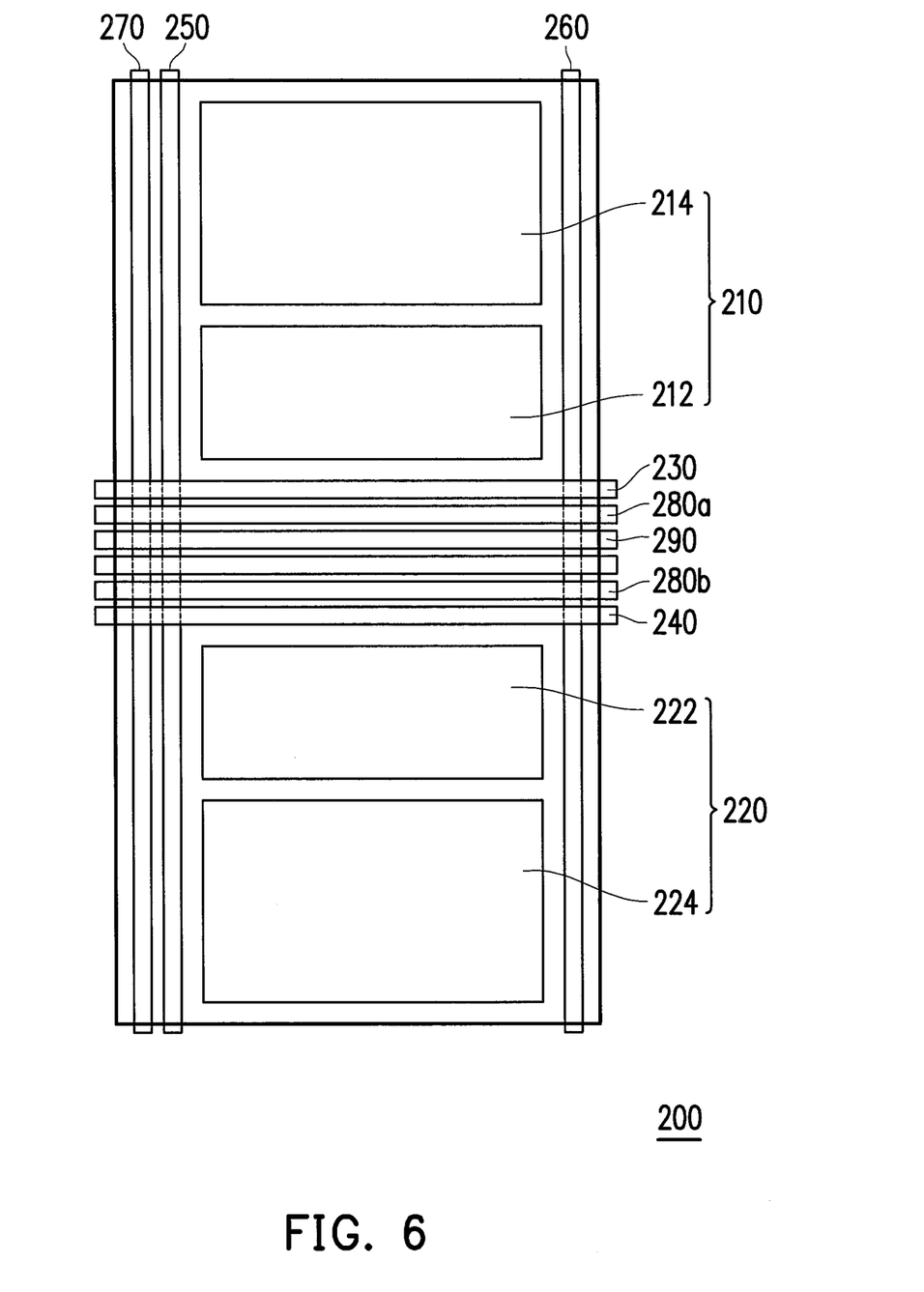
FIG. 6 is a schematic diagram of an organic light emitting display unit of another embodiment of the present invention.

The design of the above embodiment is an example wherein two pixels share two signal lines. However, in other embodiments of the present invention, a first pixel and a second pixel may share merely a reset signal line or merely a light emitting signal line. Referring to FIG. 6, FIG. 6 is a schematic diagram of an organic light emitting display unit of another embodiment of the present invention. In the present embodiment, an organic light emitting display unit 200 includes a first pixel 210, a second pixel 220, a first scan line 230, a second scan line 240, a data line 250, a power line 260, a sustaining signal line 270, a first reset signal line 280a, a second reset signal line 280b and the common light emitting signal line 290. The first pixel 210 has a first driving circuit 212 and a first organic light emitting diode 214, and the second pixel 220 has a second driving circuit 222 and a second organic light emitting diode 224.

The organic light emitting display unit 200 differs from the organic light emitting display unit 100 mainly in that the organic light emitting display unit 200 replaces the common reset signal line 180 illustrated in FIG. 1 with the first reset signal line 280a and the second reset signal line 280b. The first reset signal line 280a and the second reset signal line 280b are electrically connected to the first pixel 210 and the second pixel 220, respectively, and the first reset signal line 280a, the second reset signal line 280b and the common light emitting signal line 290 respectively intersect with the data line 250. The common light emitting signal line 290 is substantially disposed inside the first pixel 210 and the second pixel 220, which substantially includes the disposition that the common light emitting signal line 290 is disposed between the first pixel 210 and the second pixel 220, such that the first pixel 210 and the second pixel 220 share the common light emitting signal line 290, which is conducive to decrease a layout area inside the first pixel 210 and the second pixel 220 for disposing the signal lines.

Figure 7:
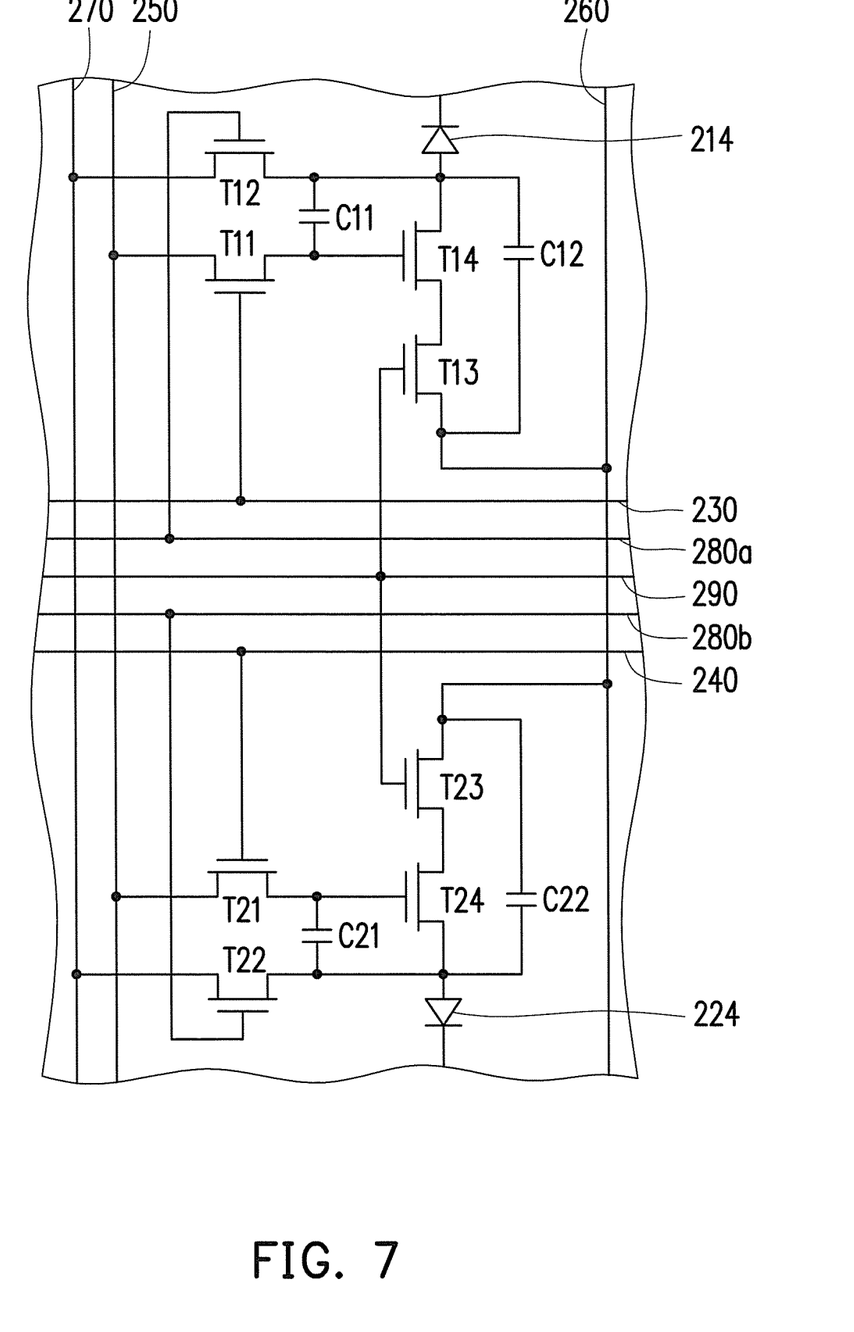
FIG. 7 is a schematic diagram of a circuit of the organic light emitting display unit of the embodiment of the present invention depicted in FIG. 6.

FIG. 7 is a schematic diagram of a circuit of the organic light emitting display unit of the embodiment of the present invention in FIG. 6. Referring to FIG. 7, in the present embodiment, a circuit layout of the organic light emitting display unit 200 differs from that of the organic light emitting display unit 100 mainly in that the organic light emitting display unit 200 replaces the common reset signal line 180 with the first reset signal line 280a and the second reset signal line 280b. Therefore, the second switch T12 of the first pixel 210 is connected to the first reset signal line 280a, and the second switch T22 of the second pixel 220 is connected to the second reset signal line 280b. The first pixel 210 and the second pixel 220 share the common light emitting signal line 290, such that a layout area of the first pixel 210 and the second pixel 220 for disposing the signal lines is decreased.

Figure 8:
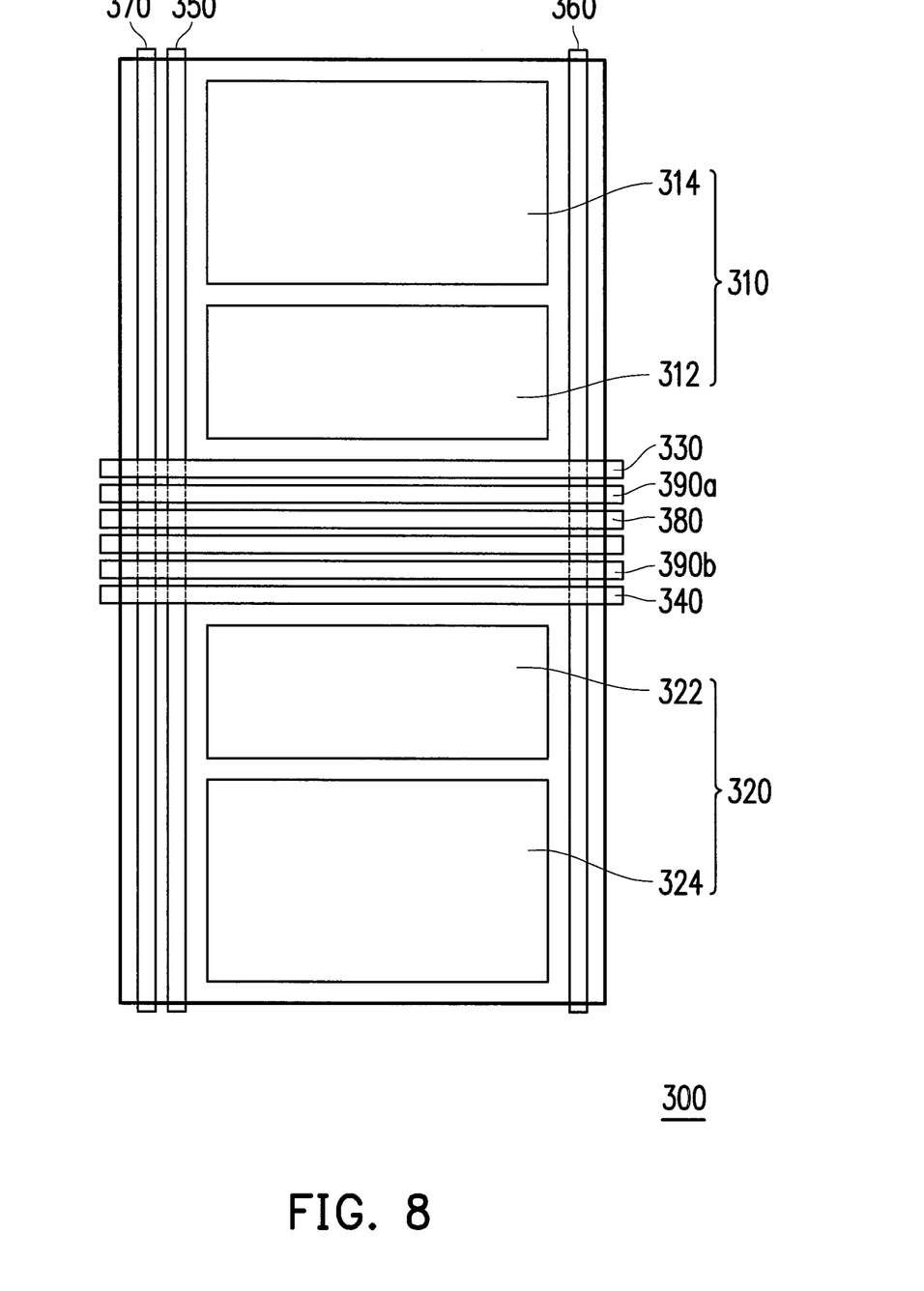
FIG. 8 is a schematic diagram of an organic light emitting display unit of still another embodiment of the present invention.

FIG. 8 is a schematic diagram of an organic light emitting display unit of still another embodiment of the present invention. Referring to FIG. 8, in the present embodiment, an organic light emitting display unit 300 includes a first pixel 310, a second pixel 320, a first scan line 330, a second scan line 340, a data line 350, a power line 360, a sustaining signal line 370, a common reset signal line 380, a first light emitting signal line 390a and a second light emitting signal line 390b. The first pixel 310 has a first driving circuit 312 and a first organic light emitting diode 314, and the second pixel 320 has a second driving circuit 322 and a second organic light emitting diode 324.

The organic light emitting display unit 300 differs from the organic light emitting display unit 100 mainly in that the organic light emitting display unit 300 replaces the common light emitting signal line 190 with the first light emitting signal line 390a and the second light emitting signal line 390b. The first light emitting signal line 390a and the second light emitting signal line 390b are electrically connected to the first pixel 310 and the second pixel 320, respectively, and the common reset signal line 380, the first light emitting signal line 390a and the second light emitting signal line 390b respectively intersect with the data line 350. The common reset signal line 380 is disposed inside the first pixel 310 and the second pixel 320, such that the first pixel 310 and the second pixel 320 share the common reset signal line 380, which is conducive to decrease a layout area inside the first pixel 310 and the second pixel 320 for disposing the signal lines.

Figure 9:
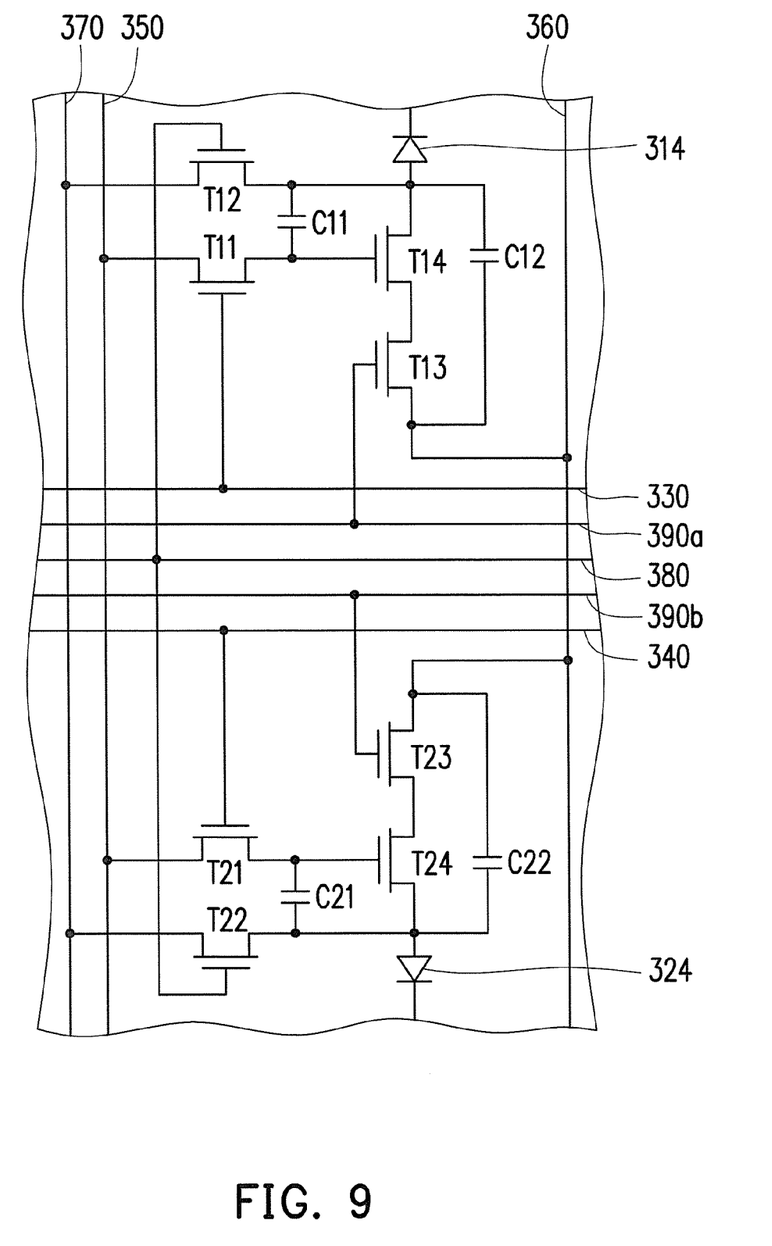
FIG. 9 is a schematic diagram of a circuit of the organic light emitting display unit of the embodiment of the present invention depicted in FIG. 8.

FIG. 9 is a schematic diagram of a circuit of the organic light emitting display unit of the embodiment of the present invention in FIG. 8. Referring to FIG. 9, in the present embodiment, a circuit layout of the organic light emitting display unit 300 differs from that of the organic light emitting display unit 100 mainly in that the organic light emitting display unit 300 replaces the common light emitting signal line 190 with the first light emitting signal line 390a and the second light emitting signal line 390b. Therefore, the third switch T13 of the first pixel 310 is connected to the first light emitting signal line 390a, and the third switch T23 of the second pixel 320 is connected to the second light emitting signal line 390b. The first pixel 310 and the second pixel 320 share the common reset signal line 380 to decrease a layout area of the first pixel 310 and the second pixel 320 for disposing the signal lines.

According to the above, in the embodiments of the present invention, a first pixel and a second pixel selectively use both of a common reset signal line and a common light emitting signal line at the same time, or use either of a common reset signal line and a common light emitting signal line, with respectively two reset signal lines or two light emitting signal lines. In the embodiments of the present invention, under a situation where the number of the signal lines is decreased, an electric signal is still properly transmitted to the first pixel and the second pixel, without being affected by the change in device.

In summary, the present invention provides an organic light emitting display unit structure, wherein a first pixel and a second pixel share a common reset signal line, a common light emitting signal line or both, so as to decrease a layout area originally required for disposing the signal lines, and increase a light emitting area of an organic light emitting diode. The present invention further provides an organic light emitting display unit circuit, in which an error rate of light emitting current of an organic light emitting diode is remained at a certain value (e.g. 3%) or below when the number of the signal lines is decreased in an organic light emitting display unit. Based on this, the organic light emitting display unit is able to provide a light source with a sufficient brightness by a low current, thus increasing a life span of the organic light emitting display unit.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An organic light emitting display unit structure comprising:
   a first pixel and a second pixel, adjacent to each other, wherein the first pixel has a first driving circuit and a first organic light emitting diode, and the second pixel has a second driving circuit and a second organic light emitting diode;
   a first scan line and a second scan line, the first scan line being electrically connected to the first pixel, the second scan line being electrically connected to the second pixel; a data line, intersecting with the first scan line and the second scan line, and electrically connected to the first pixel and the second pixel;
   a power line, electrically connected to the first pixel and the second pixel; a sustaining signal line, electrically connected to the first pixel and the second pixel;
   a first reset signal line, substantially disposed between the first organic light emitting diode and the second organic light emitting diode, and configure to provide a reset signal to the first driving circuit and the second driving circuit, wherein within a frame period of a reset stage, the reset signal provides a reset pulse, and the reset stage is defined as a period between a rising edge and a falling edge of the reset pulse; and a first light emitting signal line, substantially disposed between the first organic light emitting diode and the second organic light emitting diode, and electrically connected to at least one of the first driving circuit and the second driving circuit, wherein the first scan line is configured to provide a first scan signal having a plurality of first scan pulses, the second scan line is configured to provide a second scan signal having a plurality of second scan pulses; and in the frame period, a number of the plurality of the first scan pulses is one more than a number of the plurality of the second scan pulses.

2. The organic light emitting display unit structure as claimed in claim 1, wherein the first reset signal line is electrically connected to both of the first driving circuit and the second driving circuit.

3. The organic light emitting display unit structure as claimed in claim 2, wherein the first light emitting signal line is electrically connected to both of the first driving circuit and the second driving circuit.

4. The organic light emitting display unit structure as claimed in claim 3, wherein each of the first and second driving circuits comprises:
   a first switch, having a first terminal, a second terminal and a third terminal, wherein the first terminal is connected to the data line, the second terminal of the first switch of the first driving circuit is connected to the first scan line, and the second terminal of the first switch of the second driving circuit is connected to the second scan line;
   a second switch, having a first terminal, a second terminal and a third terminal, wherein the first terminal is connected to the sustaining signal line, and the second terminal is connected to the first reset signal line;
   a third switch, having a first terminal, a second terminal and a third terminal, wherein the first terminal is connected to the power line, and the second terminal is connected to the first light emitting signal line;
   a fourth switch, having a first terminal, a second terminal and a third terminal, wherein the first terminal is coupled to the third terminal of the third switch, the second terminal is coupled to the third terminal of the first switch, and the third terminal is coupled to the third terminal of the second switch;
   a first capacitor, having a first terminal and a second terminal, wherein the first terminal is coupled to the third terminal of the first switch, and the second terminal is coupled to the third terminal of the second switch; and
   a second capacitor, having a first terminal and a second terminal, wherein the first terminal is coupled to the first terminal of the third switch.

5. The organic light emitting display unit structure as claimed in claim 4, wherein each of the first and second organic light emitting diodes comprises a first terminal and a second terminal, the first terminal of the first and second organic light emitting diodes is coupled to the third terminal of the fourth switch of the first and second driving circuits respectively, and wherein the second terminal of the second capacitor of the first driving circuit is coupled to the first terminal of the first organic light emitting diode, and the second terminal of the second capacitor of the second driving circuit is coupled to the first terminal of the second organic light emitting diode.

6. The organic light emitting display unit structure as claimed in claim 5, wherein for each of the first and second driving circuits, in a compensation stage, a first driving current provided by the power line enters the third switch and charges the first capacitor through the fourth switch; and in a light emitting stage, a second driving current is transmitted to the first organic light emitting diode and the second organic light emitting diode, so that the first and second light emitting diodes emit light.

7. The organic light emitting display unit structure as claimed in claim 1, further comprising a second reset signal line, wherein the first light emitting signal line is electrically connected to both of the first driving circuit and the second driving circuit, the first reset signal line is electrically connected to the first driving circuit, and the second reset signal line is electrically connected to the second driving circuit.

8. The organic light emitting display unit structure as claimed in claim 7, wherein the second reset signal line is substantially disposed between the first organic light emitting diode and the second organic light emitting diode.

9. The organic light emitting display unit structure as claimed in claim 7, wherein each of the first and second driving circuits comprises:
    a first switch, having a first terminal, a second terminal and a third terminal, wherein the first terminal is connected to the data line, the second terminal of the first switch of the first driving circuit is connected to the first scan line, and the second terminal of the first switch of the second driving circuit is connected to the second scan line;
    a second switch, having a first terminal, a second terminal and a third terminal, wherein the second terminal of the second switch of the first driving circuit is connected to the first reset signal line, the second terminal of the second switch of the second driving circuit is connected to the second reset signal line, and the first terminal is connected to the sustaining signal line;
    a third switch, having a first terminal, a second terminal and a third terminal, wherein the first terminal is connected to the power line, and the second terminal is connected to the first light emitting signal line;
    a fourth switch, having a first terminal, a second terminal and a third terminal, wherein the first terminal is coupled to the third terminal of the third switch, the second terminal is coupled to the third terminal of the first switch, and the third terminal is coupled to the third terminal of the second switch;
    a first capacitor, having a first terminal and a second terminal, wherein the first terminal is coupled to the third terminal of the first switch, and the second terminal is coupled to the third terminal of the second switch; and
    a second capacitor, having a first terminal and a second terminal, wherein the first terminal is coupled to the first terminal of the third switch.

10. The organic light emitting display unit structure as claimed in claim 9, wherein each of the first and second organic light emitting diodes comprises a first terminal and a second terminal, the first terminal of the first and second organic light emitting diodes is coupled to the third terminal of the fourth switch of the first and second driving circuits respectively, and wherein the second terminal of the second capacitor of the first driving circuit is coupled to the first terminal of the first organic light emitting diode, and the second terminal of the second capacitor of the second driving circuit is coupled to the first terminal of the second organic light emitting diode.

11. The organic light emitting display unit structure as claimed in claim 10, wherein for each of the first and second driving circuits, in a compensation stage, a first driving current provided by the power line enters the third switch and charges the first capacitor through the fourth switch; and in a light emitting stage, a second driving current is transmitted to the first organic light emitting diode and the second organic light emitting diode, so that the first and second light emitting diodes emit light.

12. The organic light emitting display unit structure as claimed in claim 1, further comprising a second light emitting signal line, wherein the first reset signal line is electrically connected to both of the first driving circuit and the second driving circuit, the first light emitting signal line is electrically connected to the first driving circuit, and the second light emitting signal line is electrically connected to the second driving circuit.

13. The organic light emitting display unit structure as claimed in claim 12, wherein the second light emitting signal line is substantially disposed between the first organic light emitting diode and the second organic light emitting diode.

14. The organic light emitting display unit structure as claimed in claim 12, wherein each of the first and second driving circuits comprises:
    a first switch, having a first terminal, a second terminal and a third terminal, wherein the first terminal is connected to the data line, the second terminal of the first switch of the first driving circuit is connected to the first scan line, and the second terminal of the first switch of the second driving circuit is connected to the second scan line;
    a second switch, having a first terminal, a second terminal and a third terminal, wherein the first terminal is connected to the sustaining signal line, and the second terminal is connected to the first reset signal line;
    a third switch, having a first terminal, a second terminal and a third terminal, wherein the first terminal is connected to the power line, the second terminal of the third switch of the first driving circuit is connected to the first light emitting signal line, and the second terminal of the third switch of the second driving circuit is connected to the second light emitting signal line;
    a fourth switch, having a first terminal, a second terminal and a third terminal, wherein the first terminal is coupled to the third terminal of the third switch, the second terminal is coupled to the third terminal of the first switch, and the third terminal is coupled to the third terminal of the second switch;
    a first capacitor, having a first terminal and a second terminal, wherein the first terminal is coupled to the third terminal of the first switch, and the second terminal is coupled to the third terminal of the second switch; and
    a second capacitor, having a first terminal and a second terminal, wherein the first terminal is coupled to the first terminal of the third switch.

15. The organic light emitting display unit structure as claimed in claim 14, wherein each of the first and second organic light emitting diodes comprises a first terminal and a second terminal, the first terminal of the first and second organic light emitting diodes is coupled to the third terminal of the fourth switch of the first and second driving circuits respectively, and wherein the second terminal of the second capacitor of the first driving circuit is coupled to the first terminal of the first organic light emitting diode, and the second terminal of the second capacitor of the second driving circuit is coupled to the first terminal of the second organic light emitting diode.

16. The organic light emitting display unit structure as claimed in claim 15, wherein for each of the first and second driving circuits, in a compensation stage, a first driving current provided by the power line enters the third switch and charges the first capacitor through the fourth switch; and in a light emitting stage, a second driving current is transmitted to the first organic light emitting diode and the second organic light emitting diode, so that the first and second light emitting diodes emit light.

17. The organic light emitting display unit structure as claimed in claim 1, further comprising a power extension line, wherein the power line is electrically connected to the first pixel and the second pixel through the power extension line.

18. The organic light emitting display unit structure as claimed in claim 1, wherein the first pixel and the second pixel substantially have the same light emitting area.

19. The organic light emitting display unit structure as claimed in claim 1, wherein the first scan line, the second scan line, the first reset signal line and the first light emitting signal line extend along a first direction.

20. The organic light emitting display unit structure as claimed in claim 1, wherein the data line, the power line and the sustaining signal line extend along a second direction substantially perpendicular to the first direction.

* * * * *